(12) United States Patent
Hayashi

(10) Patent No.: US 8,138,799 B2
(45) Date of Patent: Mar. 20, 2012

(54) INTER-PHASE SKEW DETECTION CIRCUIT FOR MULTI-PHASE CLOCK, INTER-PHASE SKEW ADJUSTMENT CIRCUIT, AND SEMICONDUCTOR INTEGRATED CIRCUIT

(75) Inventor: Tomohiro Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/972,178

(22) Filed: Dec. 17, 2010

(65) Prior Publication Data

US 2011/0156757 A1   Jun. 30, 2011

(30) Foreign Application Priority Data

Dec. 28, 2009 (JP) ................ P2009-298374

(51) Int. Cl.
*H03D 13/00* (2006.01)
*H03L 7/00* (2006.01)
(52) U.S. Cl. .............. 327/3; 327/12; 327/161; 327/237; 327/244; 327/270; 324/76.77
(58) Field of Classification Search ............... 327/2, 3, 327/12, 161, 231, 237, 243–245, 269–271; 324/76.77
See application file for complete search history.

(56) References Cited

U.S. PATENT DOCUMENTS

| | | | |
|---|---|---|---|
| 4,876,699 A * | 10/1989 | Nelson | 375/328 |
| 6,564,359 B2 * | 5/2003 | Saeki | 716/113 |
| 6,737,852 B2 * | 5/2004 | Soma et al. | 324/76.74 |
| 7,555,089 B2 * | 6/2009 | Faulkner | 375/371 |
| 7,791,390 B2 * | 9/2010 | Kuroki | 327/231 |
| 7,912,167 B2 * | 3/2011 | Saeki | 375/355 |

FOREIGN PATENT DOCUMENTS

| | | | | |
|---|---|---|---|---|
| JP | 55075343 A | * | 6/1980 | |
| JP | 2002163034 A | | 6/2002 | |
| JP | 2008541657 A | | 11/2008 | |
| WO | 03036313 A | | 5/2003 | |

\* cited by examiner

*Primary Examiner* — Lincoln Donovan
*Assistant Examiner* — Patrick O'Neill

(57) ABSTRACT

An inter-phase skew detection circuit includes a frequency division circuit that frequency-divides N-phase clocks to be measured at predetermined timings so as to generate N+2 frequency-divided clocks; a phase comparison target clock generation circuit that generates N phase comparison target clocks by using predetermined N frequency-divided clocks among the N+2 frequency-divided clocks; a phase comparison reference clock generation circuit that generates N reference clocks by using the N+2 frequency-divided clocks, in accordance with predetermined combinations between the N+2 frequency-divided clocks and an operation criterion; and a phase comparison circuit that detects respective phase differences between the N phase comparison target clocks and the corresponding N reference clocks.

9 Claims, 6 Drawing Sheets

INTER-PHASE SKEW DETECTION CIRCUIT FOR MULTI-PHASE CLOCK, INTER-PHASE SKEW ADJUSTMENT CIRCUIT, AND SEMICONDUCTOR INTEGRATED CIRCUIT

Priority is claimed on Japanese Patent Application No. 2009-298374, filed Dec. 28, 2009, the contents of which are incorporated herein by reference.

BACKGROUND OF THE INVENTION

1. Field of the Invention

The present invention relates to an inter-phase skew detection circuit for detecting a phase offset (skew) for multi-phase clocks, an inter-phase skew adjustment circuit employing the inter-phase skew detection circuit, and a semiconductor integrated circuit (LSI) employing the inter-phase skew adjustment circuit.

2. Description of the Related Art

Multi-phase clocks (clock signals) such as 2-phase clocks or 4-phase clocks are used in a semiconductor integrated circuit (called an "LSI"). After the clock signals are distributed within an LSI, an offset (called "skew") from an ideal value for the inter-phase between different phases occurs due to a difference between distributed -delays within the relevant clock tree, or a delay error caused by a dispersion between manufactured clock distribution drivers. Therefore, a delay margin is reduced, which may cause an erroneous, operation.

In consideration of the above, a function for uniformizing the phase difference between different phases during generation from a clock signal to multi-phase clocks has been proposed (see, for example, Patent Document 1, FIG. 1, paragraph [0035]).

As a relevant technique, a data edge-to-clock edge phase detector has been proposed (see, for example, Patent Document 2). Patent Document 2 discloses a method and a corresponding system for detecting a skew between a data signal and a reference clock signal so that the data signal is in synchronism with the reference clock signal (see FIG. 1, and paragraphs [0012] and [0013] of Patent Document 2).

As another relevant technique, a clock skew, measurement apparatus has been proposed (see, for example, Patent Document 3). Patent Document 3 has an object to provide a clock skew measurement apparatus so as to efficiently measure a skew between on-chip clock signals (see lines 4 to 19 on page 2 of the specification of Patent Document 3).

Patent Document 1: Japanese Unexamined Patent Application, First Publication No. 2002-163034.

Patent Document 2: Published Japanese Translation, No. 2008-541657, of PCT International Publication, No. WO 2006127068

Patent Document 3: Pamphlet of PCT International Publication, No. WO 03/036313

In an ideal state for the multi-phase clocks, there is a "360/N" phase difference between adjacent signals belonging to N-phase clock signals. In order to measure a skew from "360/N", reference clocks having such "360/N" phase difference are required. However, no device for accurately implementing such reference clocks at the end of a clock distribution system is known.

SUMMARY OF THE INVENTION

In light of the above circumstances, an object of the present invention is to generate reference clocks for detecting an inter-phase skew of multi-phase clocks within a semiconductor integrated circuit, so as to eliminate necessity of input of multi-phase reference clocks from an external device.

Therefore, the present invention provides an inter-phase skew detection circuit comprising:

a frequency division circuit that frequency-divides N-phase clocks to be measured at predetermined timings so as to generate N+2 frequency-divided clocks;

a phase comparison target clock generation circuit that generates N phase comparison target clocks by using predetermined N frequency-divided clocks among the N+2 frequency-divided clocks;

a phase comparison reference clock generation circuit that generates N reference clocks by using the N+2 frequency-divided clocks, in accordance with predetermined combinations between the N+2 frequency-divided clocks and an operation criterion; and a phase comparison circuit that detects respective phase differences between the N phase comparison target clocks and the corresponding N reference clocks.

In the inter-phase skew detection circuit of the present invention, no reference clocks are input from any device outside an semiconductor integrated circuit (LSI), but an end part of the clock distribution system in the LSI generates reference clocks for inter-phase skew detection by using the multi-phase clocks themselves. The reference clocks are respectively compared with the phase comparison target clocks. Specifically, the present invention has a frequency division circuit that frequency-divides N-phase clocks to be measured at predetermined timings; a phase comparison target clock generation circuit that generates phase comparison target clocks by using the frequency-divided clocks; a phase comparison reference clock generation circuit that generates reference clocks by using the frequency-divided clocks; and a phase comparison circuit that detects respective phase differences between the comparison target clocks and the corresponding reference clocks. The phase comparison reference clocks do not provide an absolute value of "360/N" degrees for the phase difference, but the reference clock corresponding to the Kth clock of the N-phase clocks has a phase which divides the phase difference between the (K−1)th phase and the (K+1)th phase into two equals values.

Accordingly, the reference clocks for performing the inter-phase skew detection of the multi-phase clocks can be generated within the semiconductor integrated circuit (LSI). Therefore, it is unnecessary to input reference clocks for multi-phase from an external device into an LSI, and thus it is possible to reduce skews of multi-phase clocks which function as internal clock signals, without increasing the number of external pins of the LSI.

The above-described Patent Document 1 discloses no inter-phase skew detecting function after the clock distribution; and no technique for generating reference clocks, which are used in the skew detection for multi-phase clocks, within an semiconductor integrated circuit.

The above-described Patent Document 2 also discloses no technique for generating reference clocks, which are used in the skew detection for multi-phase clocks, within an semiconductor integrated circuit.

The above-described Patent Document 3 also discloses no technique for generating reference clocks, which are used in the skew detection for multi-phase clocks, within an semiconductor integrated circuit.

DETAILED DESCRIPTION OF THE INVENTION

Hereinafter, embodiments of the present invention will be described with reference to the appended figures.

Figure 1:
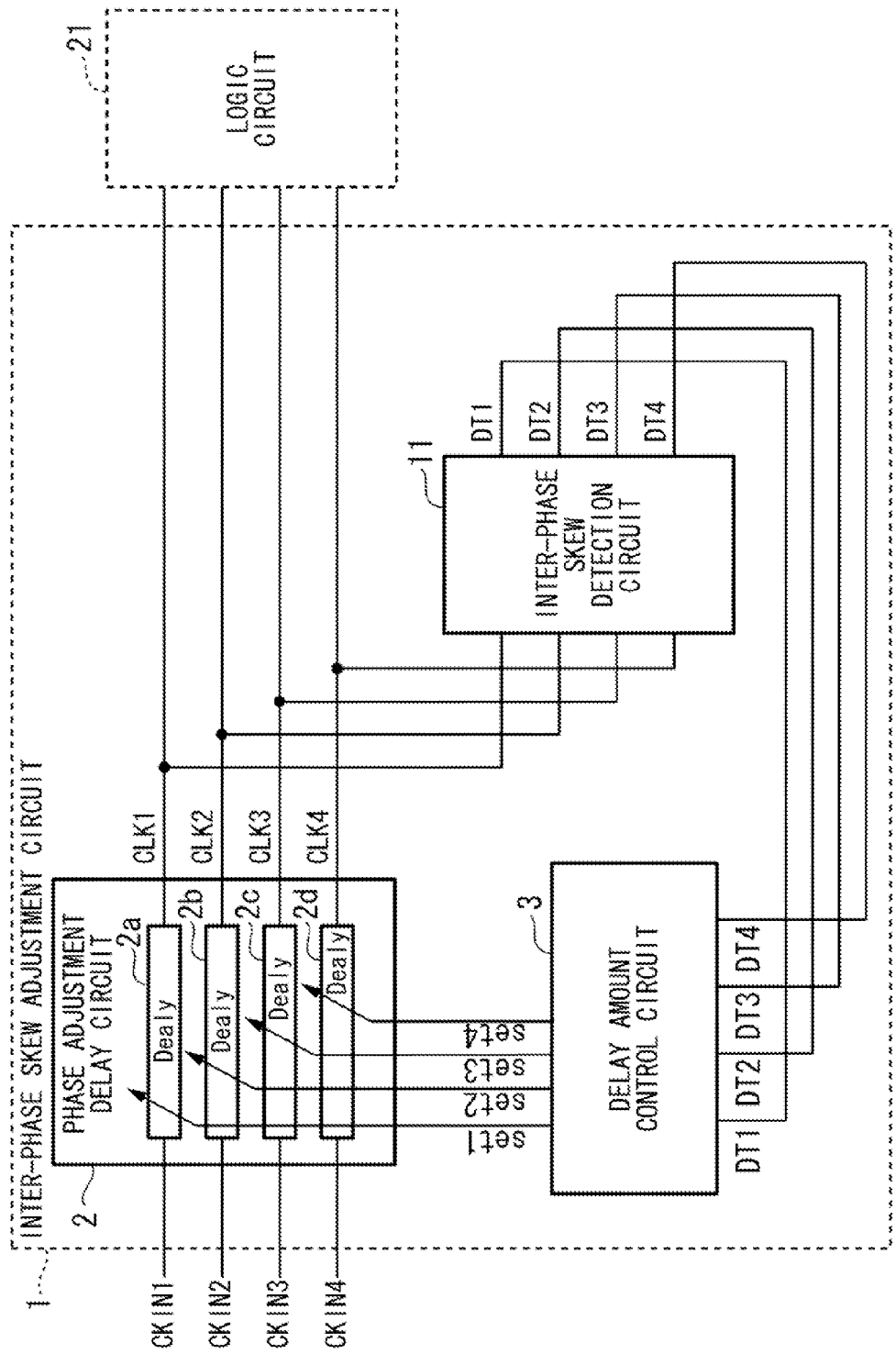
FIG. 1 is a block diagram showing the structure of an inter-phase skew adjustment circuit relating to an embodiment of the present invention.

FIG. 1 is a block diagram showing the structure of an inter-phase skew adjustment circuit 1 relating to an embodiment of the present invention. The inter-phase skew adjustment circuit 1 in FIG. 1 employs 4-phase clocks (i.e., N=4 of N-phase clocks). More specifically, FIG. 1 shows a clock distribution system in a semiconductor integrated circuit, and includes a phase adjustment delay circuit 2, a delay amount control circuit 3, and an inter-phase skew detection circuit 11. In the inter-phase skew adjustment circuit 1 in FIG. 1, the phases of externally input clocks (clock signals) CKIN1, CKIN2, CKIN3, and CKIN4 of the 4-phase are each adjusted by the phase adjustment delay circuit 2, so as to generate phase-adjusted 4-phase clocks (clock signals) CLK1, CLK2, CLK3, and CLK4 (as internal clock signals), which are supplied to a logic circuit 21 in the semiconductor integrated circuit The phase adjustment delay circuit 2 respectively subjects the 4-phase externally input clocks CKIN1, CKIN2, CKIN3, and CKIN4 to delay adjustment using delay elements (represented by "Delay") 2a, 2b, 2c, and 2d, so as to generate the 4-phase clocks CLK1, CLK2, CLK3, and CLK4 as the internal clocks in the relevant semiconductor integrated circuit, where the amount of delay applied by each element is variable. The amounts of delay of the delay elements 2a, 2b, 2c, and 2d are respectively set based on delay amount setting signals Set1, Set2, Set3, and Set4 output from the delay amount control circuit 3.

The delay amount control circuit 3 receives (signals of) phase comparison results DT1, DT2, DT3, and DT4 output from the inter-phase skew detection circuit 11 explained later, and controls each delay value of the phase adjustment delay circuit 2 in accordance with the delay amount setting signals Set1, Set2, Set3, and Set4. For example, in order to provide a phase difference of 180 degrees between the clocks CLK1 and CLK3 (as explained later), the delay amount control circuit 3 controls the delay amounts (for the clocks CLK1 and CLK3) in the phase adjustment delay circuit 2 so that the phase comparison result DT1 coincides with the phase comparison result DT3 (i.e., DT1=DT3) in the inter-phase skew detection circuit 11.

Figure 2:
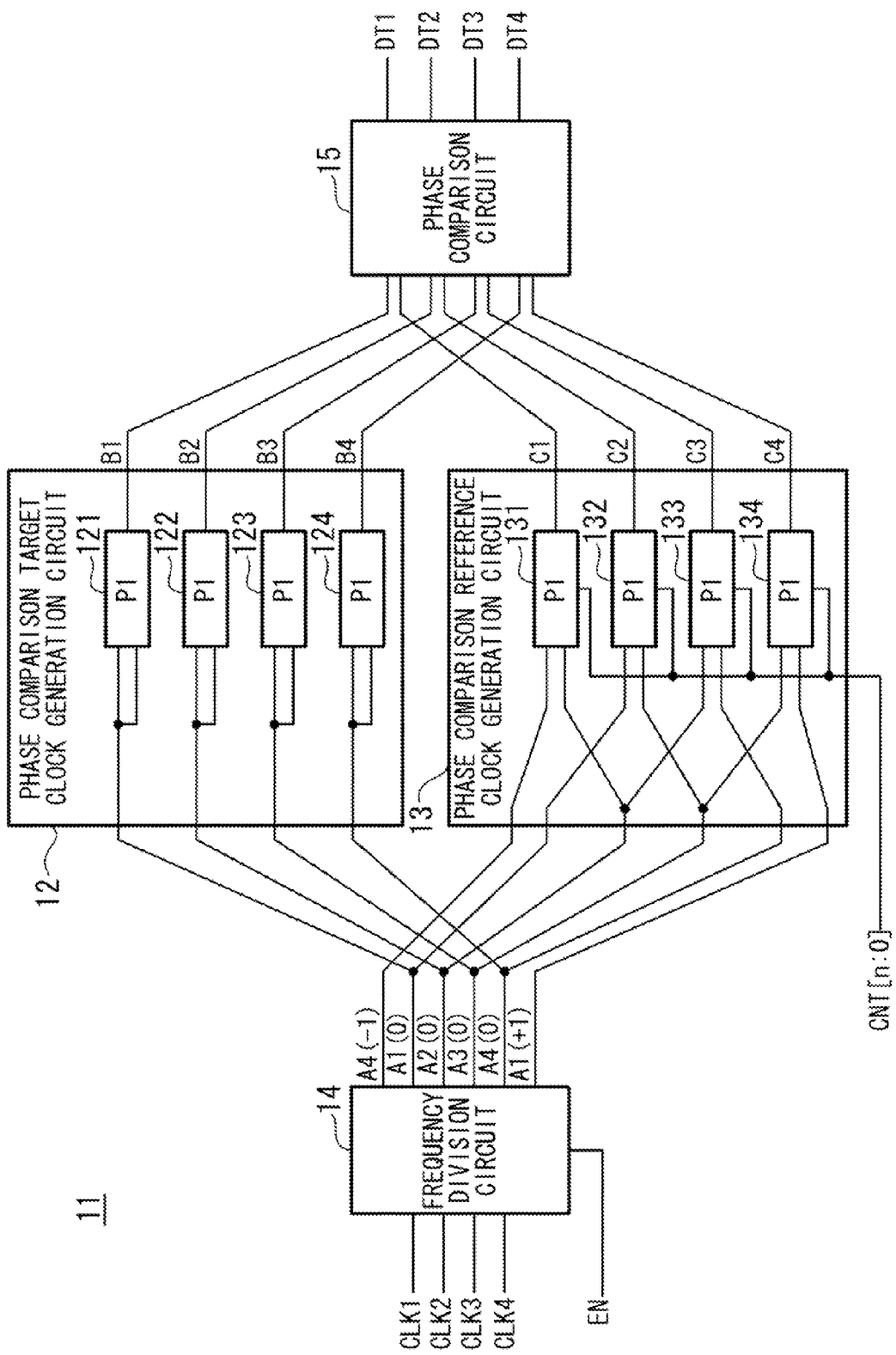
FIG. 2 is a block diagram showing the structure of the inter-phase skew detection circuit in FIG. 1.
Figure 3:
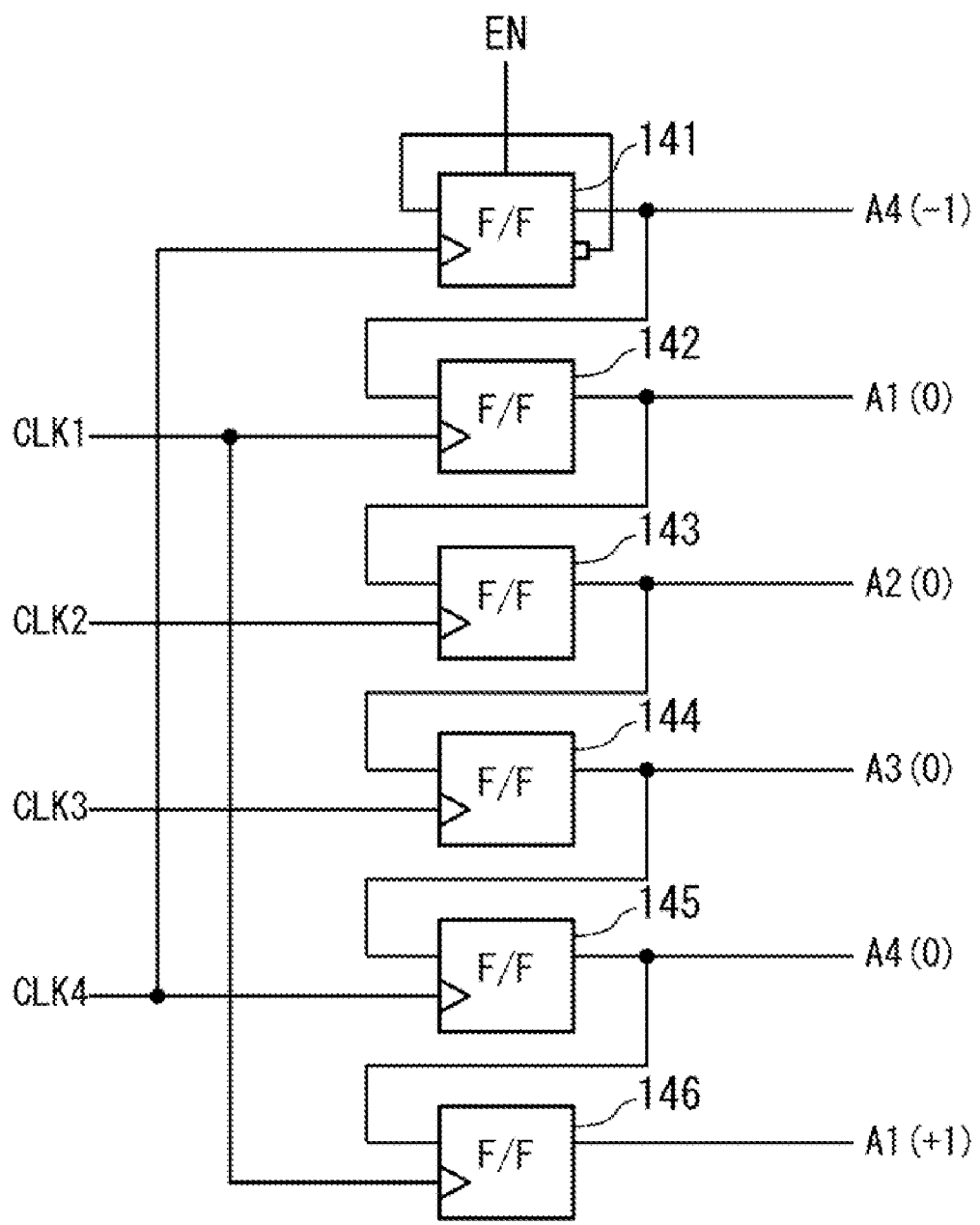
FIG. 3 is a diagram showing an example of the circuit structure of the frequency division circuit in FIG. 2.

FIG. 2 is a block diagram showing the structure of the inter-phase skew detection: circuit 11. FIG. 3 shows an example of the circuit structure of a frequency division circuit 14.

In the inter-phase skew detection circuit 11 of FIG. 2, the frequency division circuit 14 receives the 4-phase clocks CLK1, CLK2, CLK3, and CLK4 as measurement targets, and generates six frequency-divided clocks (clock signals) A4(−1), A1(0), A2(0), A3(0), A4(0), and A1(+1) in a manner such that each of the frequency-divided clocks (A4(−1) and so on) has a period twice as much as the period of each of the 4-phase clocks CLK1, CLK2, CLK3, and CLK4.

As shown in FIG. 3, the frequency division circuit 14 consists of N+2 FFs (D flip-flops in FIG. 3). In case of the 4-phase clocks, six FFs 141, 142, 143, 144, 145, and 146 are provided. The first FF 141 starts the frequency division when receiving an enable signal EN, and outputs the frequency-divided clock A4(−1) in synchronism with the rising edge of the clock CLK4.

The second FF 142 receives the frequency-divided clock A4(−1), and outputs the frequency-divided clock A1(0) in synchronism with the rising edge of the clock CLK1.

The third FF 143 receives the frequency-divided clock A1(0), and outputs the frequency-divided clock A2(0) in synchronism with the rising edge of the clock CLK2.

The fourth FF 144 receives the frequency-divided clock A2(0), and outputs the frequency-divided clock A3(0) in synchronism with the rising edge of the clock CLK3.

The fifth FF 145 receives the frequency-divided clock A3(0), and outputs the frequency-divided clock A4(0) in synchronism with the rising edge of the clock CLK4.

The sixth FF 146 receives the frequency-divided clock A4(0), and outputs the frequency-divided clock A1(+1) in synchronism with the rising edge of the clock CLK1.

Figure 4:
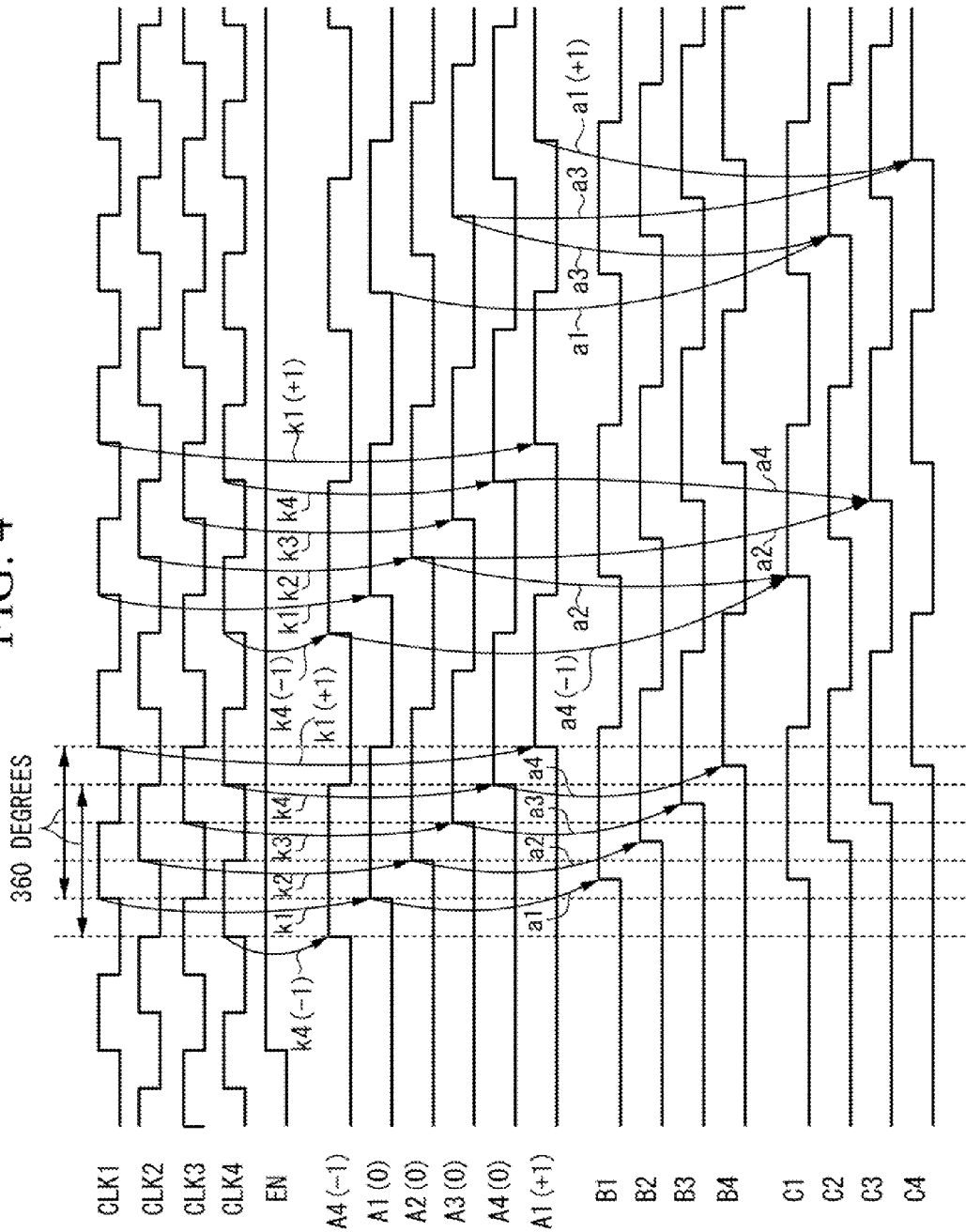
FIG. 4 is a timing chart showing the operation of the inter-phase skew detection circuit.

FIG. 4 is a timing chart showing an example of the waveforms of the clocks CLK1, CLK2, CLK3, and CLK4, and the frequency-divided clocks A4(−1), A1(0), A2(0), A3(0), A4(0), and A1(+1) generated by the frequency division circuit 14.

As shown in FIG. 4, the frequency-divided clocks A4(−1), A1(0), A2(0), A3(0), A4(0), and A1(+1) are generated during 2 clock cycles of the clock CLK4.

Additionally, in synchronism with the rising edge of the clock CLK4, the frequency-divided clock A4(−1) rises from "0" (Low) to "1" (High) (see arrow KA4(−1) in FIG. 4).

Similarly, in synchronism with the rising edge of the clock CLK1, the frequency-divided clock A1(0) rises from "0" (Low) to "1" (High) (see arrow K1).

Similarly, in synchronism with the rising edge of the clock CLK2, the frequency-divided clock A2(0) rises from "0" (Low) to "1" (High) (see arrow K2).

Similarly, in synchronism with the rising edge of the clock CLK3, the frequency-divided clock A3(0) rises from "0" (Low) to "1" (High) (see arrow K3).

Similarly, in synchronism with the rising edge of the clock CLK4, the frequency-divided clock A4(0) rises from "0" (Low) to "1" (High) (see arrow K4).

Similarly, in synchronism with)the rising edge of the clock CLK1, the frequency-divided clock A1(+1) rises from "0" (Low) to "1" (High) (see arrow K1(+1)).

FIG. 2 also shows a phase comparison target clock generation circuit 12, which receives the frequency-divided clocks A1(0), A2(0), A3(0), and A4(0), and generates phase comparison target clocks (clock signals) B1, B2, B3, and B4. The phase comparison target clock generation circuit 12 consists of N phase interpolators (called "PIs"), and thus four PIs for the 4-phase clocks.

The first PI 121 receives the frequency-divided clock A1(0), and outputs the phase comparison target clock B1.

The second PI 122 receives the frequency-divided clock A2(0), and outputs the phase comparison target clock B2.

The third PI 123 receives the frequency-divided clock A3(0), and outputs the phase comparison target clock B3.

The fourth PI 124 receives the frequency-divided clock A4(0), and outputs the phase, comparison target clock B4.

Figure 5A:
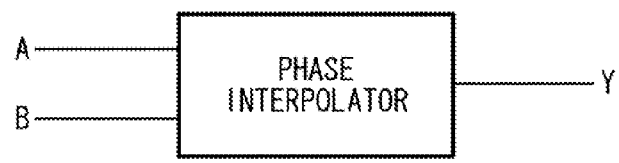
FIGS. 5A to 5C are diagrams showing the operation of the phase interpolator.
Figure 5B:
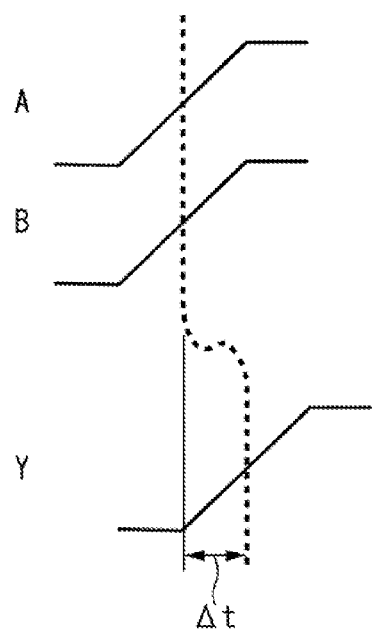
Figure 5C:
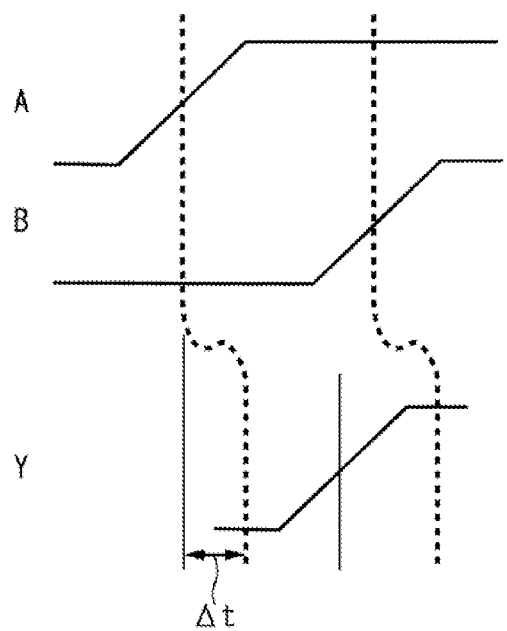

FIGS. 5A to 5C are diagrams showing phase relationships between input and output signals for a phase interpolator (PI). As shown in FIG. 5B, the PI has two input signals A and B, and one output signal Y.

When the input signals A and B have the same phase (see FIG. 5B), the output signal has been delayed (in comparison with the input signals) by a delay Δt within the circuit.

When the input signals A and B have different phases (see FIG. 5C), the output signal Y has an intermediate phase between the input signals A and B, and also has been delayed by the delay Δt within the circuit.

The phase comparison target clock generation circuit 12 is used for delaying the frequency-divided clock (A1(0) or the like) so as to generate the phase comparison target clock (B1 or the like), thereby cancelling a delay time of each (phase comparison) reference clock (clock signal) (C1 or the like) in comparison with each frequency-divided clock (A4(−1) or the like) input into a (phase comparison) reference clock generation circuit 13. That is, in the reference clock generation circuit 13 used for adding together two frequency-divided clocks and dividing the sum thereof by 2, a certain time is required until a signal is output, and thus the output signal has a basic delay Δt. This delay Δt is cancelled using the phase comparison target clock generation circuit 12.

As shown in FIG. 2, control signals CNT [n:0] formed by a plurality of bits are input into each PI, and the composition rate between input signals A and B (to the PI) can be adjusted by performing switching between the control signals, so that a desired phase of the output signal Y can be set.

The reference clock generation circuit 13 receives the frequency-divided clocks A4(−1), A1(0), A2(0), A3(0), A4(0), and A1(+1), and generates reference clocks C1, C2, C3, and C4. The reference clock generation circuit 13 includes N PIs, that is, four PIs for the 4-phase clocks.

The first PI 131 receives the frequency-divided clocks A4(−1) and A2(0), and outputs the reference clock C1. The reference clock C1 is a clock signal obtained by adding the frequency-divided clocks A4(−1) and A2(0), and dividing the added result by 2, that is, "C1=(A4(−1)+A2(0))/2".

The second PI 132 receives the frequency-divided clocks A1(0) and A3(0), and outputs the reference clock C2. The reference clock C2 is a clock signal obtained by adding the frequency-divided clocks A1(0) and A3(0), and dividing the added result by 2, that is, "C2=(A1(0)+A3(0))/2".

The third PI 133 receives the frequency-divided clocks A2(0) and A4(0), and outputs the reference clock C3. The reference clock C3 is a clock signal obtained by adding the frequency-divided clocks A2(0) and A4(0), and dividing the added result by 2, that is, "C3=(A2(0)+A4(0))/2".

The fourth PI 134 receives the frequency-divided clocks A3(0) and A1(+1), and outputs the reference clock C4. The reference clock C4 is a clock signal obtained by adding the frequency-divided clocks A3(0) and A1(+1), and dividing the added result by 2, that is, "C4=(A3(0)+A1(+1))/2".

The timing chart in FIG. 4 also shows an example of the waveforms of the frequency-divided clocks (i.e., A4(−1) and the like) and the reference clocks (i.e., C1 and the like). As shown in FIG. 4, the reference clock generation circuit 13 generates the reference clock C1 having a phase at an intermediate position between the frequency-divided clocks A4(−1) and A2(0) (see arrows a4(−1) and a2), where a delay corresponding to a circuit delay of the PI 131 is added, as explained above with reference to FIG. 5C (the other reference clocks each have a similar delay due to the corresponding PI).

Similarly, the reference clock generation circuit 13 generates the reference clock C2 having a phase at an intermediate position between the frequency-divided clocks A1(0) and A3(0) (see arrows a1 and a3).

Similarly, the reference clock generation circuit 13 generates the reference clock C3 having a phase at an intermediate position between the frequency-divided clocks A2(0) and A4(0) (see arrows a2 and a4).

Similarly, the reference clock generation circuit 13 generates the reference clock C4 having a phase at an intermediate position between the frequency-divided clocks A3(0) and A1(+1) (see arrows a3 and a1(+1)).

In the inter-phase skew detection circuit 11, the phase comparison target clocks B1, B2, B3, and B4 and the reference clocks C1, C2, C3, and C4 into a phase comparison circuit 15, so as to detect a phase difference between each pair of the compared clocks. The phase comparison circuit 15 has N FFs (flip-flops, not shown), that is, four FFs for the 4-phase clocks.

The first FF receives the clock B1, and outputs the phase comparison result DTI in synchronism with the reference clock C1.

The second FF receives the clock B2, and outputs the phase comparison result DT2 in synchronism with the reference clock C2.

The third FF receives the clock B3, and outputs the phase comparison result DT3 in synchronism with the reference clock C3.

The fourth FF receives the clock B4, and outputs the phase comparison result DT4 in synchronism with the reference clock C4.

Next, the total operation of the inter-phase skew detection circuit 11 in FIG. 2 will be explained with reference to the timing chart of FIG. 4. As described above, FIG. 4 is a timing chart for the 4-phase clock, where the horizontal axis indicates time, and the N-phase (4-phase) clocks CLK1, CLK2, CLK3, and CLK4, the frequency-divided clocks A4(−1), A1(0), A2(0), A3(0), A4(0), and A1(+1), the phase comparison target clocks B1, B2, B3, and B4, and the reference clocks C1, C2, C3, and C4 are sequentially indicated along the vertical axis.

When the 4-phase clocks CLK1, CLK2, CLK3, and CLK4 are distributed and an enable signal is input into the frequency division circuit 14, the first FF 141 of the frequency division circuit 14 synchronizes with CLK4, and starts the frequency-dividing operation by means of toggling. After that, the FFs 142, 143, 144, and 145 respectively and sequentially output signals in synchronism with the clocks CLK1, CLK2, CLK3, and CLK4. Lastly, the FF 146 outputs the 6th signal (i.e., (N+2)th signal) in synchronism with the clock CLK1. Accordingly, within the two cycles of the clock CLK4, the frequency-divided clocks A4(−1), A1(0), A2(0), A3(0), A4(0), and A1(+1) are output.

In the reference clock generation circuit 13, the reference clocks C1, C2, C3, and C4 are generated based on the frequency-divided clocks A4(−1), A1(0), A2(0), A3(0), A4(0), and A1(+1) are output.

The first reference clock C1 is output by adding A4(−1) and A2(0), and dividing the sum (of the phases of both signal) by 2.

Similarly, the reference clock C2 is output by adding A1(0) and A3(0), and dividing the sum by 2.

Similarly, the reference clock C3 is output by adding A2(0) and A4(0), and dividing the sum by 2.

Similarly, the reference clock C4 is output by adding A3(0) and A1(+1), and dividing the sum by 2.

The phase comparison circuit 15 detects each phase difference between the reference clocks C1, C2, C3, and C4 and the phase comparison target clocks B1, B2, B3, and B4, and outputs the phase comparison results DT1, DT2, DT3, and DT4 (see FIG. 2). The phase comparison results DT1, DT2, DT3, and DT4 each are a signal having a value "1" When the phase of the phase comparison target clock (B1 or the like) leads in comparison with the compared reference clock (C1 or the like), or a value "0" when the phase of the phase comparison target clock is delayed in comparison with the reference clock.

Next, the procedure of performing phase adjustment using the inter-phase skew detection circuit 11 will be shown. As a specific example, 4-phase clocks are employed, where the four signals are relatively positioned at 0, 90, 180, and 270 degrees.

Figure 6:
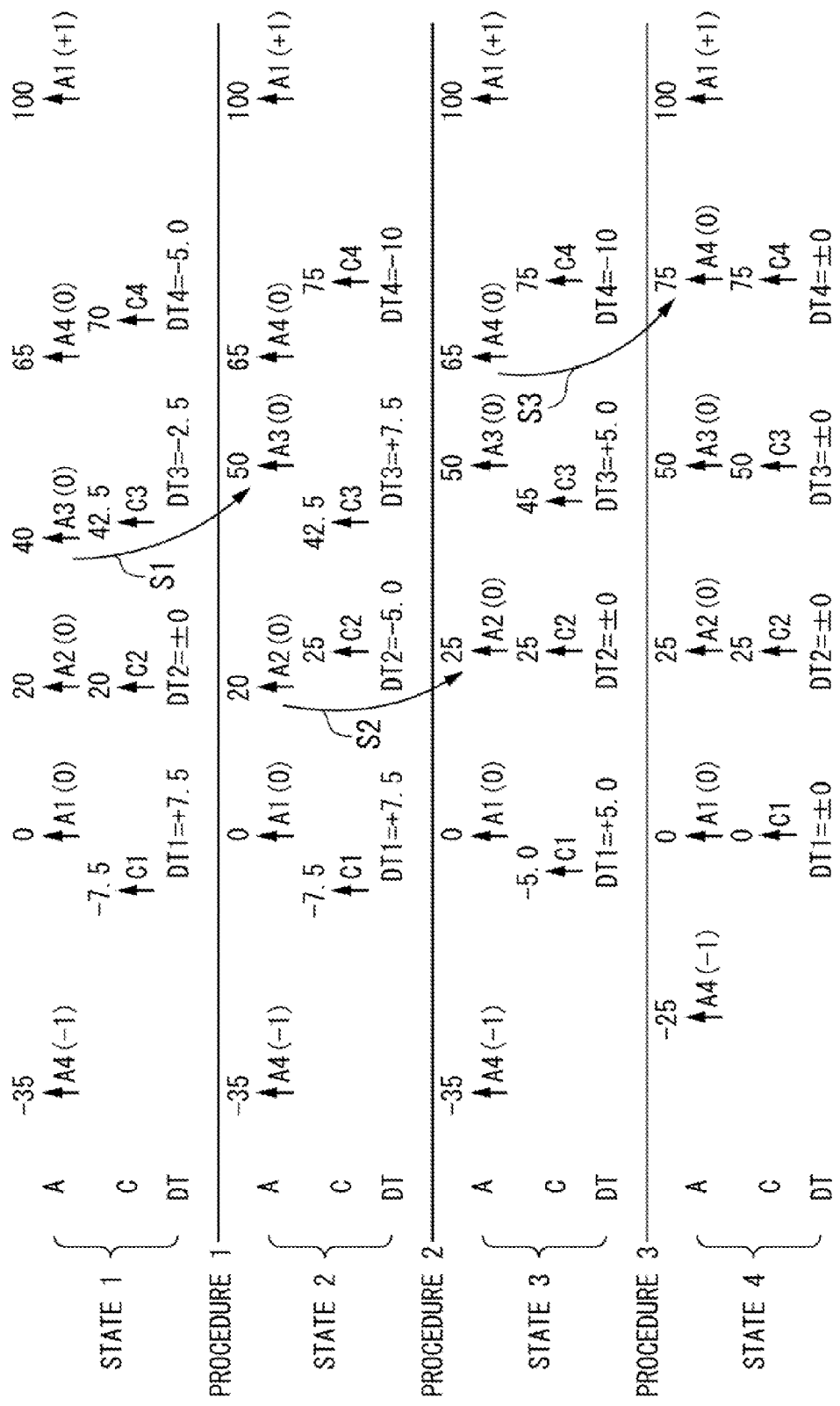
FIG. 6 is a schematic diagram showing the skew adjustment procedure for the inter-phase skew detection circuit and the inter-phase skew adjustment circuit.

FIG. 6 is a schematic diagram showing the phase adjustment procedure. In FIG. 6, the horizontal axis indicates the phase, and the frequency-divided clocks A4(−1), A1(0), A2(0), A3(0), A4(0), and A1(+1), the reference clocks C1, C2, C3, and C4, and the phase comparison results DT1, DT2, DT3, and DT4 are sequentially shown along the vertical axis for each of successive states 1, 2, 3, and 4. In addition, for each frequency-divided clock and each reference clock, the rising edge is represented by an upward arrow. Additionally, each phase comparison result is indicated as a phase difference. For the phase reference, the timing of the clock CLK1 is defined to be 0, and the period (one cycle) of CLK1 is represented by 100, so that the clocks CLK2, CLK3, and CLK4 respectively have phases of 25, 50, and 75 after the phase adjustment.

Referring to FIG. 6, it is assumed that before the adjustment (see State 1), phases of the frequency-divided clocks are such that: A4(−1)=−35, A1(0)=0, A2(0)=20, A3(0)=40, A4(0)=65, and A1(+1)=100. Therefore, the reference clocks C1, C2, C3, and C4 have the following phases:
Reference clock C1 =(A4(−1)+A2(0))/2=−7.5
Reference clock C2 =(A1(0)+A3(0))/2=20
Reference clock C3 =(A2(0)+A4(0))/2=42.5
Reference clock C4 =(A3(0)+A1(+1))/2=70

In this case, the phase comparison results DT1, DT2, DT3, and DT4 are:
phase comparison result DT1 =A1(0)−C1=+7.5
phase comparison result DT2 =A2(0)−C2=±0
phase comparison result DT3 =A3(0)−C3=−2.5
phase comparison result DT4 =A4(0)−C4=−5.0

In such a state, Procedure 1 is executed. In Procedure 1, the phase (180 degrees) of the clock CLK3 is adjusted, where CLK3 corresponds to the externally input clock CKIN 3 whose phase is adjusted by the phase adjustment delay circuit 2 in FIG. 1. The adjustment of CLK3 is executed until the phase comparison result DT3 coincides with DT1. More specifically, DT3 is adjusted so as to satisfy a relationship that "DT3=DT1=+7.5". Accordingly, regardless of the value of DT2 or DT4 as the skew detection result, the frequency-divided clock A0(3) implements 180 degrees with respect to the frequency-divided clock A1(0) (see arrow S1) because the phase difference between the reference clocks C1 and C3 is 180 degrees. Here, it is unnecessary for DT1 and DT3 to each have a phase difference of 0. In accordance with Procedure 1, the clock CLK1 and CLK3 have a phase difference of 180 degrees.

When State 2 starts after the adjustment of Procedure 1, the phases of the frequency-divided clocks are such that: A4(−1)=−35, A1(0)=0, A2(0)=20, A3(0)=50, A4(0)=65, and A1(+1)=100. Therefore, the phases of the reference clocks C1, C2, C3, and C4 are such that: C1=−7.5, C2=25, C3=42.5, and C4=65.

In this case, the phase comparison results DT1, DT2, DT3, and DT4 are: DT1=+7.5; DT2=−5.0; DT3=+7.5; and DT4=−10.

In State 2, the clock CLK2 having a phase of "90 degrees" is adjusted. Since CLK3 has a phase of 180 degrees with respect to CLK1, the reference clock C2 corresponding to the clock CLK2 has a phase of 90 degrees. That is, since there is a phase difference of 180 degrees between A1(0) and A3(0), the reference clock C2 having the intermediate phase therebetween a phase of 90 degrees with respect to A1(0). Accordingly, the phase of the clock CLK2 is adjusted by the phase adjustment delay circuit 2 so as to satisfy "DT2=0" (i.e., phase difference is 0), thereby implementing such a phase of 90 degrees (see arrow S2).

When State 3 starts after the adjustment of Procedure 2, the phases of the frequency-divided clocks are such that: A4(−1)=−35, A1(0)=0, A2(0)=25, A3(0)=50, A4(0)=65, and A1(+1)=100. Therefore, the phases of the reference clocks C1, C2, C3, and C4 are such that: C1=−5.0, C2=25, C3=45, and C4=75.

In this case, the phase comparison results DT1, DT2, DT3, and DT4 are: DT1=+5.0; DT2=±0; DT3=+5.0; and DT4=−10.

In State 3, the clock CLK4 having a phase of "270 degrees" is adjusted. Similar to Procedure 2, since the reference clock C4 corresponding to the clock CLK4 has a phase of 270 degrees, the phase of the clock CLK4 is adjusted by the phase adjustment delay circuit 2 so as to satisfy "DT4=0" (i.e., phase difference is 0), thereby implementing such a phase of 270 degrees (see arrow S3).

When State 4 starts after the adjustment of Procedure 3, the phases of the frequency-divided clocks are such that: A4(−1)=−25, A1(0)=0, A2(0)=25, A3(0)=50, A4(0)=75, and A1(+1)=100. Therefore, the phases of the reference clocks C1, C2, C3, and C4 are such that: C1=±0, C2=25, C3=50, and C4=75.

In this case, the phase comparison results DT1, DT2, DT3, and DT4 are: DT1=±0; DT2=±0; DT3=±0; and DT4=±0.

By executing the above-described Procedures 1, 2, and 3, the clocks CLK1, CLK2, CLK3, and CLK4 respectively have adjusted phases of 0, 25, 50, and 75, so that each skew between adjacent clock signals is equal.

As described above, in the present embodiment, no reference clocks are input from any device outside the relevant LSI, but an end part of the clock distribution system in the LSI generates reference clocks C1, C2, C3, and C4 for inter-phase skew detection by using the multi-phase clocks themselves. The reference clocks C1, C2, C3, and C4 are respectively compared with the phase comparison target clocks B1, B2, B3, and B4, and an adjustment for equalizing each skew between the phases of the multi-phase clocks can be performed using the phase adjustment delay circuit 2.

Therefore, in the inter-phase skew detection circuit of the present invention, no reference clocks are input from any device outside an semiconductor integrated circuit (LSI), but an end part of the clock distribution system in the LSI generates reference clocks for inter-phase skew detection by using the multi-phase clocks themselves. The reference clocks can be respectively compared with phase comparison target clocks. In addition, for N-phase clocks (to be measured), which are input into the inter-phase skew detection circuit, a phase adjustment delay circuit is provided.

In addition, the phase comparison reference clocks generated by the inter-phase skew detection circuit do not provide an absolute value of "360/N" degrees for the phase difference, but the reference clock corresponding to the Kth clock of the N-phase clocks has a phase which divides the phase difference between the (K−1)th phase and the (K+1)th phase into two equals values. Accordingly, in the inter-phase skew adjustment for the N-phase clocks is performed by the phase adjustment delay circuit based on the signals indicating the phase comparison results output from the. phase comparison circuit, when the phase of the Kth clock is adjusted, the phase of the reference clock corresponding to the (K−1)th clock and the phase of the reference clock corresponding to the (K+1)th clock simultaneously shift. This characteristic is effectively used for implementing a preferable adjustment procedure.

Although an embodiment of the present invention has been explained, the inter-phase skew detection circuit of the present invention can also be applied a system in which multi-phase clocks are differential clock signals (e.g., differential clock signals CK/CK# in a DDR-SDRAM). Such a case has the same circuit structure as that shown in FIGS. 1 and 2. However, in the phase adjustment function, since the clock of 180 degrees has a reverse phase with respect to the clock of 0 degrees, the phase of the clock of 180 degrees is adjusted by controlling the duty ratio of the clock of 0 degrees. Similarly, since the clock of 270 degrees has a reverse phase with respect to the clock of 90 degrees, the phase of the clock of 270 degrees is adjusted by controlling the duty ratio of the clock of 90 degrees.

Below, the corresponding relationship between the above-described embodiment and the present invention will be shown.

The N-phase clocks (to be measured) in the present invention correspond to the clocks CLK1, CLK2, CLK3, and CLK4.

The N+2 frequency-divided clocks in the present invention correspond to the frequency-divided clocks A4(−1), A1(0), A2(0), A3(0), A4(0), and A1(+1).

The phase comparison target clocks in the present invention correspond to the phase comparison target clocks B1, B2, B3, and B4.

The phase comparison reference clocks in the present invention correspond to the phase comparison reference clocks C1, C2, C3, and C4.

The externally input clocks input into the phase adjustment delay circuit in the present invention correspond to the externally input clocks CKIN1, CKIN2, CKIN3, and CKIN4.

The inter-phase skew detection circuit in the present invention corresponds to the inter-phase skew detection circuit 11.

The frequency division circuit in the present invention corresponds to the frequency division circuit 14.

The phase comparison target clock generation circuit in the present invention corresponds to the phase comparison target clock generation circuit 12.

The phase comparison reference clock generation circuit 13 in the present invention corresponds to the phase comparison reference clock generation circuit 13.

The phase comparison circuit 15 in the present invention corresponds to the phase comparison circuit 15.

The phase adjustment delay circuit 2 in the present invention corresponds to the phase adjustment delay circuit 2.

In the above-described embodiment, the inter-phase skew detection circuit 11 has:

(i) the frequency division circuit 14 which frequency-divides the N-phase clocks CKIN1, CKIN2, CKIN3, and CKIN4 (to be measured) at predetermined timings so as to generate-the N+2 frequency-divided clocks A4(−1), A1(0), A2(0), A3(0), A4(0), and A1(+1);

(ii) the phase comparison target clock generation circuit 12 which generates the N phase comparison target clocks B1, B2, B3, and B4 by using the predetermined N frequency-divided clocks A1(0), A2(0), A3(0), and A4(0);

(iii) the phase comparison reference clock generation circuit 13 which generates the N reference clocks C1, C2, C3, and C4 by using the N+2 frequency-divided clocks A4(−1), A1(0), A2(0), A3(0), A4(0), and A1(+1), in accordance with predetermined combinations between the frequency-divided clocks and an operation criterion; and (iv) the phase comparison circuit 15 which detects respective phase differences between the N phase comparison target clocks B1, B2, B3, and B4 and the corresponding N reference clocks C1, C2, C3, and C4.

As described above, in the inter-phase skew detection circuit of the present invention, for the N+2 frequency-divided clocks generated by the N-phase clocks as the measurement targets, the N reference clocks are generated in accordance with the predetermined combinations between the frequency-divided clocks (e.g., each combination between frequency-divided clocks which interpose another frequency-divided clock) and the operation criterion (e.g., to compute a phase by adding two frequency-divided clocks and dividing the sum by 2). Accordingly, the reference clocks used for detecting each inter-phase skew between the multi-phase clocks can be generated within the semiconductor integrated circuit (LSI).

Also in the above embodiment:

(i) the frequency division circuit 14 receives the 4-phase clocks consisting of the first phase clock CLK1, the second phase clock CLK2, the third phase clock CLK3, and the fourth phase clock CLK4, and sequentially generates the six (i.e., first, second, third, fourth, fifth, and sixth) frequency-divided clocks A4(−1), A1(0), A2(0), A3(0), A4(0), and A1(+1) respectively in synchronism with the fourth phase clock CLK4, the first phase clock CLK1, the second phase clock CLK2, the third phase clock CLK3, the fourth phase clock CLK4, and the first phase clock CLK1, where each frequency-divided clock has a period twice as much as that of each 4-phase clock;

(ii) the phase comparison target clock generation circuit 12 delays each of four frequency-divided clocks from the second frequency-divided clock A1(0) to the fifth frequency-divided clock A4(0) among the six frequency-divided clocks A4(−1), A1(0), A2(0), A3(0), A4(0), and A1(+1) by a predetermined delay amount, so as to generate the four (first, second, third, and fourth) phase comparison target clocks B1, B2, B3, and B4;

(iii) the phase comparison reference clock generation circuit 13 generates the four (first, second, third, and fourth) reference clocks C1, C2, C3, and C4 based on the six frequency-divided clocks A4(−1), A1(0), A2(0), A3(0), A4(0), and A1(+1), wherein for each of combinations of "the first frequency-divided clock A4(−1) and the third frequency-divided clock A2(0)", "the second frequency-divided clock A1(0) and the fourth frequency-divided clock A3(0)", "the third frequency-divided clock A2(0) and the fifth frequency-divided clock A4(0)", and "the fourth frequency-divided clock A3(0) and the sixth frequency-divided clock A1(+1)", each of the reference clocks C1, C2, C3, and C4 is generated by adding together both frequency-divided clocks and dividing the sum by 2; and (iv) the phase comparison circuit 15 detects four respective phase differences between the four phase comparison target clocks B1, B2, B3, and B4 and the corresponding four reference clocks C1, C2, C3, and C4.

As described above, for the 4-phase clocks, the reference clocks C1, C2, C3, and C4 are generated based on the combinations of "the frequency-divided clock A4(−1) and the frequency-divided clock A2(0)", "the frequency-divided clock A1(0) and the frequency-divided clock A3(0)", "the frequency-divided clock A2(0) and the frequency-divided clock A4(0)", and "the frequency-divided clock A3(0) and the frequency-divided clock A1(+1)", where the combined frequency-divided clocks interpose another one frequency-divided clock. Accordingly, the reference clocks for performing the inter-phase skew detection of the multi-phase clocks can be generated within the semiconductor integrated circuit (LSI).

Also in the above embodiment, the inter-phase skew adjustment circuit 1 includes the inter-phase skew detection circuit 11, and also includes the phase adjustment delay circuit 2 for adjusting each phase of the N-phase (4-phase) clocks CKIN1, CKIN2, CKIN3, and CKIN4 input into the frequency division circuit 14, based on the phase comparison results obtained by the phase comparison circuit 15 in the inter-phase skew detection circuit 11.

Accordingly, the reference clocks C1, C2, C3, and C4 for performing the inter-phase skew detection of the multi-phase clocks can be generated within the semiconductor integrated circuit (LSI), and each inter-phase skew between the N-phase clocks CKIN1, CKIN2, CKIN3, and CKIN4 can be adjusted. Therefore, it is unnecessary to input reference clocks for multi-phase from an external device into an LSI, and thus it is possible to prevent skews of reference clocks themselves from being distributed within the LSI, without increasing the number of external pins of the LSI.

While preferred embodiments of the present invention have been described and illustrated above, it should be understood that these are exemplary embodiments of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. An inter-phase skew detection circuit comprising:
   a frequency division circuit that frequency-divides N-phase clocks to be measured at predetermined timings so as to generate N+2 frequency-divided clocks, where N is an integer of 2 or greater;
   a phase comparison target clock generation circuit that generates N phase comparison target clocks by using predetermined N frequency-divided clocks among the N+2 frequency-divided clocks;
   a phase comparison reference clock generation circuit that generates N reference clocks by using the N+2 frequency-divided clocks, in accordance with predetermined combinations between the N+2 frequency-divided clocks and an operation criterion; and
   a phase comparison circuit that detects respective phase differences between the N phase comparison target clocks and the corresponding N reference clocks.

2. The inter-phase skew detection circuit in accordance with claim 1, wherein:
   the frequency division circuit receives the N-phase clocks which are 4-phase clocks consisting of first, second, third, and fourth phase clocks, and sequentially generates six frequency-divided clocks consisting of first, second, third, fourth, fifth, and sixth frequency-divided clocks respectively in synchronism with the fourth phase clock, the first phase clock, the second phase clock, the third phase clock, the fourth phase clock, and the first phase clock, where each frequency-divided clock has a period twice as much as that of each 4-phase clock;
   the phase comparison target clock generation circuit delays each of four frequency-divided clocks including the second frequency-divided clock to the fifth frequency-divided clock among the six frequency-divided clocks by a predetermined delay amount, so as to generate four phase comparison target clocks consisting of first, second, third, and fourth phase comparison target clocks;
   the phase comparison reference clock generation circuit generates four reference clocks consisting of first, second, third, and fourth reference clocks based on the six frequency-divided clocks, wherein for four combinations of the first frequency-divided clock and the third frequency-divided clock, the second frequency-divided clock and the fourth frequency-divided clock, the third frequency-divided clock and the fifth frequency-divided clock, and the fourth frequency-divided clock and the sixth frequency-divided clock, each of the reference clocks is generated by adding together both frequency-divided clocks in each combination and dividing the sum thereof by 2; and
   the phase comparison circuit detects four respective phase differences between the four phase comparison target clocks and the corresponding four reference clocks.

3. The inter-phase skew detection circuit in accordance with claim 2, wherein:
   the phase comparison reference clock generation circuit uses a phase interpolators for generating each of the reference clocks by adding together both frequency-divided clocks in each combination and dividing the sum thereof by 2; and
   the phase comparison target clock generation circuit delays said each of four frequency-divided clocks by an amount of delay corresponding to a delay time of an output signal generated in the phase interpolator.

4. The inter-phase skew detection circuit in accordance with claim 1, wherein:
   the frequency division circuit receives the N-phase clocks consisting of first, second, third, . . . , and Nth phase clocks, and sequentially generates N+2 frequency-divided clocks consisting of first, second, third, . . . , (N+2)th frequency-divided clocks respectively in synchronism with the Nth phase clock, the first phase clock, the second phase clock, . . . , the (N−1)th phase clock, the Nth phase clock, and the first phase clock, where each frequency-divided clock has a period twice as much as that of each N-phase clock;
   the phase comparison target clock generation circuit delays each of N frequency-divided clocks including the second frequency-divided clock to the (N+1)th frequency-divided clock among the N+2 frequency-divided clocks by a predetermined delay amount, so as to generate N phase comparison target clocks consisting of first, second, third, . . . , and Nth phase comparison target clocks;
   the phase comparison reference clock generation circuit generates N reference clocks consisting of first, second, third, . . . , and Nth reference clocks based on the N+2 frequency-divided clocks, wherein for N combinations of the first frequency-divided clock and the third frequency-divided clock, the second frequency-divided clock and the fourth frequency-divided clock, . . . , the (N−1)th frequency-divided clock and the (N+1)th frequency-divided clock, and the Nth frequency-divided clock and the (N+2)th frequency-divided clock, each of the reference clocks is generated by adding together both frequency-divided clocks in each combination and dividing the sum thereof by 2; and the phase comparison circuit detects N respective phase differences between the N phase comparison target clocks and the corresponding N reference clocks.

5. The inter-phase skew detection circuit in accordance with claim 3, wherein:

the phase comparison reference clock generation circuit uses a phase interpolators for generating each of the reference clocks by adding together both frequency-divided clocks in each combination and dividing the sum thereof by 2; and the phase comparison target clock generation circuit delays said each of N frequency-divided clocks by an amount of delay corresponding to a delay time of an output signal generated in the phase interpolator.

6. An inter-phase skew adjustment circuit comprising:

the inter-phase skew detection circuit in accordance with claim 4; and a phase adjustment delay circuit that adjusts each phase of the N-phase clocks input into the frequency division circuit, based on the phase comparison results obtained by the phase comparison circuit in the inter-phase skew detection circuit.

7. A semiconductor integrated circuit comprising the inter-phase skew adjustment circuit in accordance with claim 6.

8. An inter-phase skew adjustment circuit comprising:

the inter-phase skew detection circuit in accordance with claim 1; and a phase adjustment delay circuit that adjusts each phase of the N-phase clocks input into the frequency division circuit, based on the phase comparison results obtained by the phase comparison circuit in the inter-phase skew detection circuit.

9. A semiconductor integrated circuit comprising the inter-phase skew adjustment circuit in accordance with claim 8.

* * * * *